US012509793B2

(12) United States Patent
Kitahara et al.

(10) Patent No.: US 12,509,793 B2
(45) Date of Patent: Dec. 30, 2025

(54) QUARTZ GLASS CRUCIBLE, MANUFACTURING METHOD THEREFOR, AND METHOD FOR MANUFACTURING SILICON SINGLE CRYSTAL

(71) Applicant: SUMCO Corporation, Tokyo (JP)

(72) Inventors: Eriko Kitahara, Akita (JP); Hiroshi Kishi, Akita (JP); Hideki Fujiwara, Tokyo (JP)

(73) Assignee: SUMCO CORPORATION, Tokyo (JP)

( * ) Notice: Subject to any disclaimer, the term of this patent is extended or adjusted under 35 U.S.C. 154(b) by 265 days.

(21) Appl. No.: 18/035,596

(22) PCT Filed: Dec. 6, 2021

(86) PCT No.: PCT/JP2021/044682
§ 371 (c)(1),
(2) Date: May 5, 2023

(87) PCT Pub. No.: WO2022/131047
PCT Pub. Date: Jun. 23, 2022

(65) Prior Publication Data

US 2024/0011183 A1 Jan. 11, 2024

(30) Foreign Application Priority Data

Dec. 18, 2020 (JP) ................................ 2020-209876

(51) Int. Cl.
*C30B 15/10* (2006.01)
*C30B 29/06* (2006.01)

(52) U.S. Cl.
CPC ............. *C30B 15/10* (2013.01); *C30B 29/06* (2013.01)

(58) Field of Classification Search
CPC ....... C03B 19/095; C30B 15/10; C30B 29/06; Y02P 40/57
See application file for complete search history.

(56) References Cited

U.S. PATENT DOCUMENTS

2004/0115440 A1 6/2004 Werdecker et al.
2005/0178319 A1 8/2005 Korus et al.
(Continued)

FOREIGN PATENT DOCUMENTS

JP 08-002932 A 1/1996
JP 2004-531449 A 10/2004
(Continued)

OTHER PUBLICATIONS

Office Action dated Feb. 22, 2024, issued in Korean patent application No. 10-2023-7015592, with English translation thereof.
(Continued)

*Primary Examiner* — Hua Qi
(74) *Attorney, Agent, or Firm* — GREENBLUM & BERNSTEIN, P.L.C.

(57) ABSTRACT

A quartz glass crucible has, from an inner surface side toward an outer surface side of the crucible, an inner transparent layer, a bubble layer, an outer transparent layer, and a crystallization accelerator-containing layer. An outer transition layer where a bubble content decreases from the bubble layer toward the outer transparent layer is provided at a boundary between the bubble layer and the outer transparent layer, and a thickness of the outer transition layer is 0.1 mm or more and 8 mm or less.

6 Claims, 9 Drawing Sheets

(56) References Cited

U.S. PATENT DOCUMENTS

| | | | |
|---|---|---|---|
| 2006/0016389 A1 | 1/2006 | Holder et al. | |
| 2010/0107970 A1 | 5/2010 | Kodama et al. | |
| 2011/0315072 A1* | 12/2011 | Sudo | C30B 29/06<br>65/17.6 |
| 2012/0137963 A1* | 6/2012 | Sudo | C30B 15/10<br>117/208 |
| 2018/0316271 A1* | 11/2018 | Yu | H02M 3/33523 |
| 2019/0316271 A1* | 10/2019 | Kishi | C30B 15/10 |
| 2020/0115820 A1 | 4/2020 | Kishi et al. | |

FOREIGN PATENT DOCUMENTS

| | | | | | |
|---|---|---|---|---|---|
| JP | 2005-523229 | A | | 8/2005 | |
| JP | 2008-507467 | A | | 3/2008 | |
| JP | 2010-105880 | A | | 5/2010 | |
| JP | 2012-006805 | A | | 1/2012 | |
| JP | 2012-116713 | A | | 6/2012 | |
| JP | 2015127287 | A | * | 7/2015 | C03B 19/095 |
| JP | 2020-105071 | A | | 7/2020 | |
| KR | 10-2010-0048836 | | | 5/2010 | |
| KR | 10-2019-0002594 | | | 1/2019 | |
| KR | 10-2019-0117743 | | | 10/2019 | |
| KR | 10-2020-0076636 | | | 6/2020 | |
| WO | 2018/051714 | A1 | | 3/2018 | |

OTHER PUBLICATIONS

ISR issued in International Patent Application No. PCT/JP2021/044682, Jan. 11, 2022, translation.

IPRP issued in International Patent Application No. PCT/JP2021/044682, Jun. 29, 2023, translation.

* cited by examiner

QUARTZ GLASS CRUCIBLE, MANUFACTURING METHOD THEREFOR, AND METHOD FOR MANUFACTURING SILICON SINGLE CRYSTAL

TECHNICAL FIELD

The present invention relates to a quartz glass crucible and a manufacturing method thereof, and particularly relates to a quartz glass crucible for pulling a silicon single crystal which can positively crystallize an outer surface of the crucible to improve durability, and a manufacturing method thereof. In addition, the present invention relates to a manufacturing method of a silicon single crystal using such a quartz glass crucible.

BACKGROUND ART

Most of silicon single crystals for semiconductor devices are manufactured by the Czochralski method (CZ method). In the CZ method, a polycrystalline silicon raw material is heated and melted in a quartz glass crucible, a seed crystal is immersed in the silicon melt, and the seed crystal is gradually pulled up while rotating the crucible to grow a single crystal. In order to manufacture high-quality silicon single crystals for semiconductor devices at low cost, it is necessary to be able to perform so-called multi-pulling in which not only can a yield of single crystals be increased in a single pulling step, but a plurality of silicon single crystals are pulled up from a single crucible. To this end, a crucible having a stable shape that is capable of withstanding a long-duration use is necessary.

In a quartz glass crucible of the related art, the viscosity is reduced at high temperatures of 1400° C. or higher when pulling up the silicon single crystal, and thus the initial shape thereof cannot be maintained and deformation of the crucible such as buckling or inward collapse occurs. Accordingly, fluctuations in a melt surface level of silicon melt, damage to the crucible, contact with components in a furnace, and the like become issues. In addition, an inner surface of the crucible is crystallized by coming into contact with the silicon melt during the pulling of single crystal, and cristobalite called a brown ring is formed. However, when the cristobalite is peeled and incorporated into the growing silicon single crystal, this causes dislocation.

In order to solve this type of issues, a method of positively crystallizing a wall surface of a crucible to increase the strength of the crucible is proposed. For example, Patent Literature 1 describes that an outer layer of a crucible side wall is formed of a doped region which contains a first component such as Ti acting as a reticulating agent in quartz glass and a second component such as Ba acting as a separation point forming agent in quartz glass and has a thickness of 0.2 mm or more, and when a crucible is heated during the pulling of crystal, cristobalite is formed in the doped region to accelerate the crystallization of the quartz glass, thereby increasing the strength of the crucible.

Patent Literature 2 describes a quartz glass crucible including a high-aluminum-content layer which has a relatively high average aluminum concentration and is provided to form an outer surface of the crucible, and a low-aluminum-content layer which has a lower average aluminum concentration than the high-aluminum-content layer that is provided inside the high-aluminum-content layer, in which the low-aluminum-content layer includes an opaque layer consisting of quartz glass containing a large number of minute bubbles, and the high-aluminum-content layer consists of transparent or translucent quartz glass having a lower bubble content than the opaque layer.

Patent Literature 3 describes a quartz glass crucible for pulling a silicon single crystal having a transparent layer, a translucent layer, and an opaque layer in that order from the inner surface side to the outer surface side of the crucible, and the transparent layer has a bubble content of less than 0.3%, and the translucent layer has a bubble content of 0.3% to 0.6%, and the opaque layer has a bubble content of more than 0.6%. According to this quartz glass crucible, pulling of homogeneous silicon single crystals is possible by suppressing localized variations in the temperature of a molten silicon in the crucible.

Patent Literature 4 describes a silica glass crucible including, from the inner surface toward the outer surface of the crucible, a transparent silica glass layer having a bubble content of less than 0.5%, a bubble-containing silica glass layer having a bubble content of 1% or more and less than 50%, and a translucent silica glass layer having a bubble content of 0.5% or more and less than 1% and an OH group concentration of 35 ppm or more and less than 300 ppm.

Patent Literature 5 describes a silica glass crucible including, in order from the inner side, a transparent layer and a bubble-containing layer, in which the ratio of the thickness of the bubble-containing layer to the thickness of the transparent layer is 0.7 to 1.4 in the intermediate portion between the upper end and the lower end of the straight body portion.

BACKGROUND ART LITERATURE

Patent Literature

Patent Literature 1: Japanese Unexamined Patent Application No. 2005-523229

Patent Literature 2: International Publication No. WO2018/051714 Brochure

Patent Literature 3: Japanese Patent Laid-open Publication No. 2010-105880

Patent Literature 4: Japanese Patent Laid-open Publication No. 2012-006805

Patent Literature 5: Japanese Patent Laid-open Publication No. 2012-116713

SUMMARY OF INVENTION

Problems to be Solved by the Invention

As described above, a crystallization accelerator is preferably used in the quartz glass crucible used for multi-pulling. According to the quartz glass crucible having an outer surface to which the crystallization accelerator is applied, deformation of the crucible can be suppressed by positively crystallizing the outer surface of the crucible.

However, even if a crystallization accelerator is used to crystallize the outer surface of the crucible, the crystallized outer surface of the crucible may crack and deform locally in a case where the bubbles in the silica glass undergo large thermal expansion due to a long-duration heating.

Accordingly, an object of the present invention is to provide a quartz glass crucible that is resistant to deformation at high temperatures during a crystal pulling step and can withstand a long-duration pulling, and a manufacturing method thereof.

Another object of the present invention is to provide a manufacturing method of a silicon single crystal that can increase a manufacturing yield using such a quartz glass crucible.

Means for Solving the Problems

In order to solve the issued noted above, a quartz glass crucible for pulling the silicon single crystal according to the present invention includes a crucible main body consisting of silica glass and a crystallization accelerator-containing layer provided on an outer surface or an outer surface layer portion of the crucible main body, in which the crucible main body includes, from an inner surface side toward an outer surface side of the crucible, an inner transparent layer containing no bubbles, a bubble layer containing a large number of bubbles and provided outside of the inner transparent layer, and an outer transparent layer containing no bubbles and provided outside of the bubble layer, and an outer transition layer where a bubble content decreases from the bubble layer toward the outer transparent layer is provided at a boundary between the outer transparent layer and the bubble layer, and a thickness of the outer transition layer is 0.1 mm or more and 8 mm or less.

In the quartz glass crucible according to the present invention, since the change in the bubble content is moderate at the boundary between the bubble layer and the outer transparent layer, local expansion of bubbles at the boundary can be prevented.

Therefore, deformation of the crucible due to thermal expansion of the bubbles can be prevented.

In the present invention, the thickness of the outer transition layer is preferably 0.67% or more and 33% or less of a wall thickness of the crucible. In a case where the outer transition layer is too thin, deformation of the crucible due to thermal expansion of the bubbles cannot be suppressed. In addition, in a case where the outer transition layer is too thick, the bubble layer becomes thin instead and thus the heat input to the crucible increases and the crucible is made likely to be deformed. Alternatively, because the outer transparent layer becomes thin, the probability of foaming and peeling of a crystal layer increases when the outer surface of the crucible crystallizes. However, in a case where the thickness of the outer transition layer is 0.67% or more and 33% or less of the wall thickness of the crucible, the issues noted above can be avoided.

Preferably, the quartz glass crucible according to the present invention has a cylindrical sidewall, a bottom, and a corner provided between the sidewall and the bottom, and the crystallization accelerator-containing layer and the outer transition layer are provided on at least one of the sidewall and the corner. As a result, deformation of the crucible can be prevented by suppressing expansion of bubbles at the sidewall or the corner.

It is preferable that the outer transition layer is provided on the sidewall and the corner, and a maximum thickness of the outer transition layer at the corner is greater than a maximum thickness of the outer transition layer at the sidewall. During the single crystal pulling step, the temperature of the corner is higher than the sidewall of the crucible and thus local expansion of bubbles is likely to occur. However, in a case where the outer transition layer of the corner is made thicker than the outer transition layer of the sidewall, local expansion of bubbles at the corner can be suppressed.

In the present invention, it is preferable that an inner transition layer where a bubble content increases from the inner transparent layer toward the bubble layer is provided at a boundary between the inner transparent layer and the bubble layer, and a maximum thickness of the inner transition layer at any portion of the sidewall, the corner, and the bottom is greater than a maximum thickness of the outer transition layer at the same part. According to this configuration, local deformation and peeling of the inner surface of the crucible due to the expansion of bubbles can be prevented.

In the present invention, the crystallization accelerator-containing layer is preferably a layer applied to the outer surface of the crucible main body. Thereby, a crystallization accelerator-containing layer having a uniform and sufficient thickness can be easily formed.

In the present invention, a crystallization accelerator contained in the crystallization accelerator-containing layer is preferably an element in the group 2, and barium is particularly preferred. As a result, the outer surface of the crucible can be positively crystallized during the single crystal pulling step to improve the durability.

In addition, a manufacturing method of a quartz glass crucible according to the present invention includes a raw material filling step of forming a deposited layer of raw material silica particles along an inner surface of a rotating mold, an arc melting step of arc melting the raw material silica particles to form a crucible main body consisting of silica glass, and a crystallization accelerator-containing layer forming step of forming a crystallization accelerator-containing layer on an outer surface or an outer surface layer portion of the crucible main body, in which the arc melting step includes an inner transparent layer forming step of forming an inner transparent layer containing no bubbles by arc melting the deposited layer while evacuating the deposited layer from a side of the inner surface of the mold, a bubble layer forming step of forming a bubble layer containing a large number of bubbles outside of the inner transparent layer by continuing the arc melting while suspending or weakening the evacuation, and an outer transparent layer forming step of forming an outer transparent layer containing no bubbles outside of the bubble layer by restarting the evacuation and continuing the arc melting, and the outer transparent layer forming step includes an outer transition layer forming step of forming an outer transition layer where a bubble content decreases from the bubble layer toward the outer transparent layer at a boundary between the bubble layer and the outer transparent layer by changing stepwise a decompression level when the evacuation is restarted.

According to the present invention, a quartz glass crucible in which the change in the bubble content is moderate at the boundary between the bubble layer and the outer transparent layer can be manufactured. Therefore, local expansion of bubbles at the boundary can be prevented and deformation of the crucible due to thermal expansion of the bubbles can be prevented.

Furthermore, a manufacturing method of a silicon single crystal according to the present invention includes pulling up a silicon single crystal by the Czochralski method using the quartz glass crucible according to the present invention. According to the present invention, the manufacturing yield of a high-quality silicon single crystal can be increased.

Effects of the Invention

According to the present invention, a quartz glass crucible that is resistant to deformation at high temperatures during the single crystal pulling step and can withstand the long-duration pulling, and a manufacturing method thereof can be provided. In addition, according to the present invention, a manufacturing method of a silicon single crystal that can increase manufacturing yield using such a quartz glass crucible can be provided.

BRIEF DESCRIPTION OF THE DRAWINGS

FIG. 3 is an enlarged view of an X portion of the quartz glass crucible illustrated in

FIG. 2.

MODE FOR CARRYING OUT THE INVENTION

Hereinafter, preferred embodiments of the present invention are described in detail with reference to the accompanying drawings.

Figure 1:
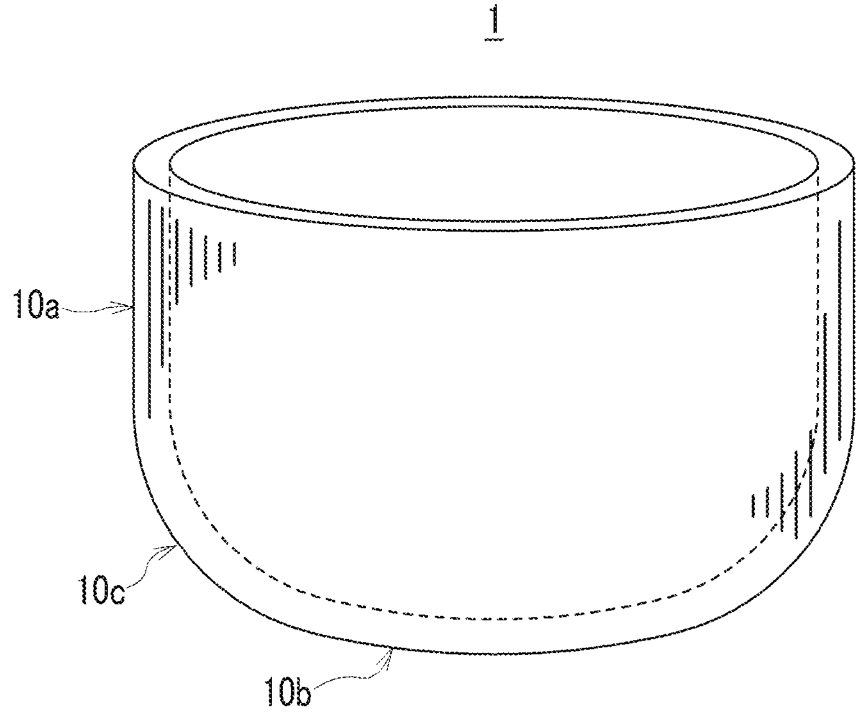
FIG. 1 is a schematic perspective view illustrating a configuration of a quartz glass crucible according to a first embodiment of the present invention.

FIG. 1 is a schematic perspective view illustrating the configuration of a quartz glass crucible according to a first embodiment of the present invention.

As shown in FIG. 1, a quartz glass crucible 1 (silica glass crucible) is a silica glass container for holding a silicon melt and has a cylindrical sidewall 10*a*, a bottom 10*b*, and a corner 10*c* provided between the sidewall 10*a* and the bottom 10*b*. The bottom 10*b* is preferably a gently curved round bottom, but may be a flat bottom.

The corner 10*c* is located between the sidewall 10*a* and the bottom 10*b* and is a portion having a larger curvature than the bottom 10*b*. The boundary position between the sidewall 10*a* and the corner 10*c* is a position where the sidewall 10*a* begins to bend. In addition, the boundary position between the corner 10*c* and the bottom 10*b* is a position where the large curvature of the corner 10*c* begins to change to the small curvature of the bottom 10*b*.

The aperture (diameter) of the quartz glass crucible 1 also varies depending on the diameter of the silicon single crystal ingot that is pulled up from the silicon melt, but is 18 inches (approximately 450 mm) or more, preferably 22 inches (approximately 560 mm) or more, and particularly preferably 32 inches (approximately 800 mm) or more. This is because such a large crucible is used for pulling up a large silicon single crystal ingot having a diameter of 300 mm or more, and is required not to affect the quality of the single crystal even with the long-duration use.

The wall thickness of the quartz glass crucible 1 varies slightly depending on its part, but it is preferable that the wall thickness of the sidewall 10*a* of the crucible of 18 inches or more is 6 mm or more, and the wall thickness of the sidewall 10*a* of the crucible of 22 inches or more is 7 mm or more, and the wall thickness of the sidewall 10*a* of the crucible of 32 inches or more is 10 mm or more. As a result, a large amount of silicon melt can be stably held at high temperatures.

Figure 2:
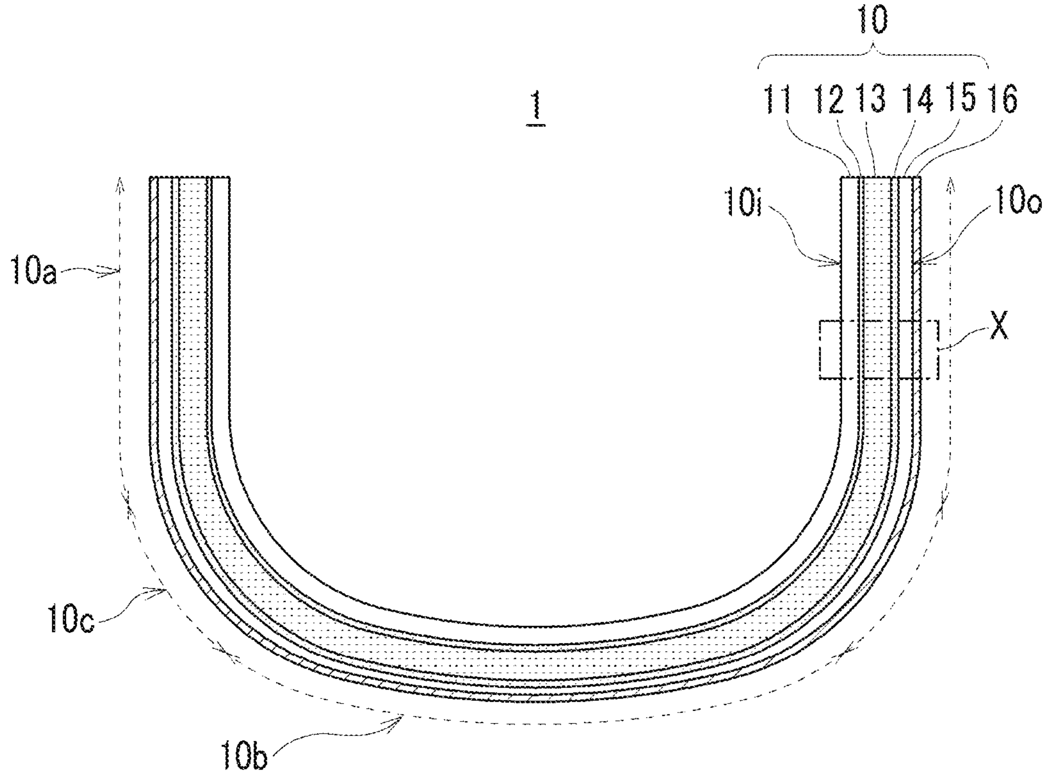
FIG. 2 is a schematic side sectional view of the quartz glass crucible illustrated in FIG. 1.

FIG. 2 is a schematic side sectional view of the quartz glass crucible illustrated in FIG. 1. In addition, FIG. 3 is an enlarged view of the X portion of the quartz glass crucible illustrated in FIG. 2.

Figure 3:
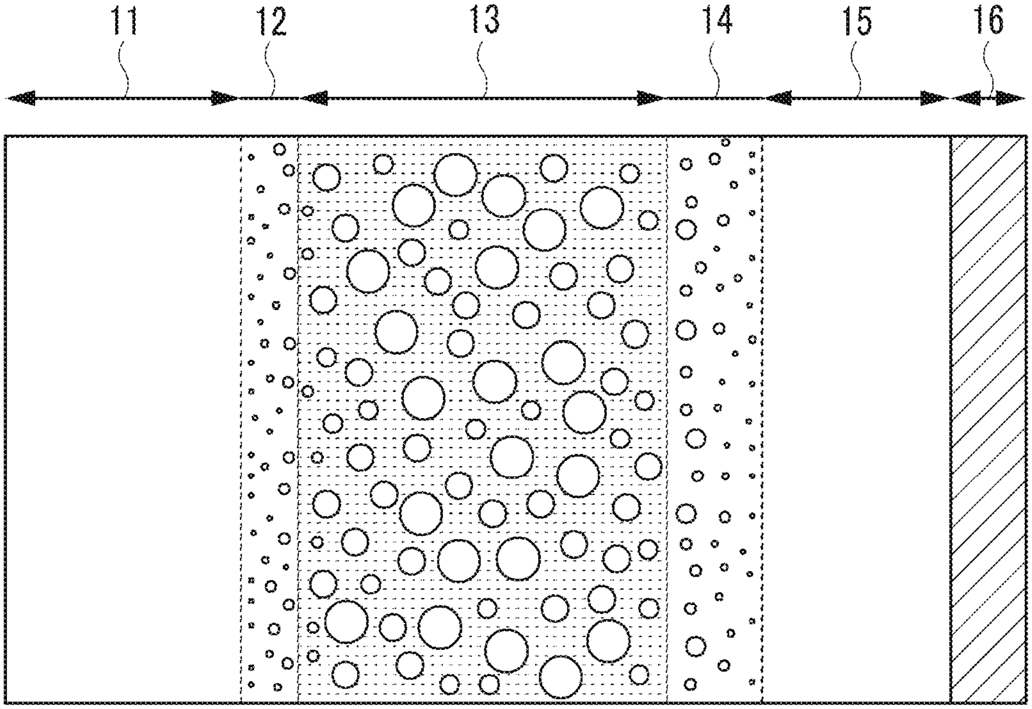

As shown in FIGS. 2 and 3, the quartz glass crucible 1 has a multi-layered structure and includes, from an inner surface 10*i* side toward an outer surface 10*o* side, an inner transparent layer 11 containing no bubbles (non-bubble layer), an inner transition layer 12 having the bubble content that increases toward the outer surface 10*o* side, a bubble layer 13 containing a large number of minute bubbles (opaque layer), an outer transition layer 14 having the bubble content that decreases toward the outer surface 10*o* side, an outer transparent layer 15 containing no bubbles (non-bubble layer), and a crystallization accelerator-containing layer 16. In the present embodiment, from the inner transparent layer 11 to the outer transparent layer 15, a crucible main body 10 consisting of silica glass is configured, and the crystallization accelerator-containing layer 16 consists of a crystallization accelerator-containing coating film formed on the outer surface of the crucible main body 10. As described later, the crystallization accelerator-containing layer 16 may be silica glass doped with a crystallization accelerator.

The inner transparent layer 11 is a layer that configures the inner surface 10*i* of the quartz glass crucible 1, and is provided to prevent a yield of the single crystal from decreasing due to bubbles in the silica glass. Since the inner surface 10*i* of the crucible that is in contact with the silicon melt reacts with the silicon melt to melt away, the bubbles near the inner surface of the crucible cannot be trapped in the silica glass, and when the bubbles burst due to thermal expansion, the crucible fragments (silica fragments) may be peeled. In a case where the crucible fragments released into the silicon melt are transported by melt convection to a growth interface of the single crystal and are incorporated into the single crystal, they cause dislocation in the single crystal. In addition, in a case where the bubbles released into the silicon melt float up and reach a solid-liquid interface and are incorporated into the single crystal, they cause a pinhole formation in the silicon single crystal. However, in a case where the inner transparent layer 11 is provided on the inner surface 10*i* of the crucible, dislocation and pinhole formation in the single crystal due to bubbles can be prevented.

Containing no bubbles in the inner transparent layer 11 means having a bubble content and a bubble size to the extent that the single crystallization rate does not decrease due to bubbles. Such a bubble content is, for example, 0.1 vol % or less, and the bubble diameter is, for example, 100 μm or less.

The thickness of the inner transparent layer 11 is preferably 0.5 to 10 mm, and is set to an appropriate thickness for every portion of the crucible such that the inner transition layer 12 is not exposed by completely vanishing the inner transparent layer 11 due to melting away during a crystal pulling step. The inner transparent layer 11 is preferably provided over the entire crucible from the sidewall 10*a* to the bottom 10*b* of the crucible, but the inner transparent layer 11 can be omitted at the upper end portion of the crucible that does not come into contact with the silicon melt.

The bubble layer 13 is an intermediate layer between the inner transparent layer 11 and the outer transparent layer 15 and is provided to improve the heat retention property of the silicon melt in the crucible and to heat the silicon melt in the crucible as uniformly as possible by dispersing the radiant heat from the heater arranged to surround the crucible in the single crystal pulling apparatus. Therefore, the bubble layer 13 is provided over the entire crucible from the sidewall 10*a* to the bottom 10*b* of the crucible.

The bubble content of the bubble layer 13 is higher than the inner transparent layer 11 and the outer transparent layer 15, and is preferably more than 0.1 vol % and 5 vol % or less. This is because in a case where the bubble content of the bubble layer 13 is 0.1 vol % or less, the bubble layer 13 cannot exhibit the required heat retention function. In addition, this is because when the bubble content of the bubble layer 13 exceeds 5 vol %, the crucible may be deformed due to the thermal expansion of the bubbles and decrease the yield of the single crystal, and further heat transfer property is insufficient. From the viewpoint of the balance between the heat retention property and the heat transfer property, the bubble content of the bubble layer 13 is particularly preferably 1 to 4 vol %. The above-mentioned bubble content is a value obtained by measuring the crucible before use under a room temperature environment. It can be visually recognized that the bubble layer 13 contains a large number of bubbles. The bubble content of the bubble layer 13 can be obtained, for example, by the specific gravity measurement (Archimedes method) of an opaque silica glass piece cut out from the crucible.

The outer transparent layer 15 is a layer provided outside of the bubble layer 13, and is provided to prevent the crystal layer from foaming and peeling when the outer surface of the crucible crystallizes during the crystal pulling step. Containing no bubbles in the outer transparent layer 15 means having a bubble content and a bubble size to the extent that foaming and peeling due to bubbles do not occur on the outer surface of the crucible. Such a bubble content is, for example, 0.1 vol % or less, and the bubble diameter is, for example, 100 μm or less.

The thickness of the outer transparent layer 15 is preferably 0.5 μm to 10 mm, and is set to an appropriate thickness for every portion of the crucible. The outer transparent layer 15 is preferably provided at the portion where the crystallization accelerator-containing layer 16 is provided. However, the outer transparent layer 15 may be provided in a portion where the crystallization accelerator-containing layer 16 is not provided.

The bubble content of the inner transparent layer 11 and the outer transparent layer 15 can be measured non-destructively using an optical detector. The optical detector includes a light receiving apparatus that receives reflected light of light irradiated internally near the surface of the crucible. The light emitter for the irradiation light may be built into the optical detector, or an external light emitter may be used. In addition, the optical detector uses a type that can be rotatably operated along the inner surface or the outer surface of the crucible. As irradiation light, in addition to visible light, ultraviolet rays, and infrared rays, X-rays, laser light, or the like can be used, and any light can be applied as long as bubbles can be detected by reflection. The light receiving apparatus is selected according to the type of irradiation light, and for example, an optical camera including a light receiving lens and an imaging portion can be used. In order to detect the bubbles existing at a certain depth from the surface, the focal point of the optical lens can be scanned in the depth direction from the surface.

The result of measurement by the optical detector is taken into an image processing apparatus, and the bubble content is calculated. In detail, an image in the vicinity of the crucible surface is captured using the optical camera, and the surface of the crucible is divided into predetermined areas to define a reference area S1. The bubble content is calculated by obtaining a bubble occupied area S2 for every reference area S1 and integrating by volume the ratio of the bubble occupied area S2 to the reference area S1.

The crystallization accelerator-containing layer 16 is provided on the outer surface 10*o* of the crucible main body 10. The crystallization accelerator contained in the crystallization accelerator-containing layer 16 accelerates crystallization of the outer surface of the crucible at high temperature during the crystal pulling step, and thus the strength of the crucible can be improved. Here, the reason why the crystallization accelerator-containing layer 16 is provided on the outer surface 10*o* side of the quartz glass crucible 1 instead of the inner surface 10*i* side is as follows. In a case where the crystallization accelerator-containing layer 16 is provided on the inner surface 10*i* side of the crucible, the risk of pinhole formation in the silicon single crystal and the risk of peeling of the crystallization layer on the inner surface of the crucible increase, but such a risk can be reduced when provided on the outer surface 10*o* side of the crucible. Furthermore, in a case where the crystallization accelerator-containing layer 16 is provided on the inner surface of the crucible, there is a risk of contamination of the single crystal due to impurity contamination of the inner surface 10*i* of the crucible. However, since the impurity contamination of the outer surface 100 of the crucible is allowed to some extent, the risk of contamination of the single crystal by providing the crystallization accelerator-containing layer 16 on the outer surface 10*o* of the crucible is low.

In the present embodiment, the crystallization accelerator-containing layer 16 is provided over the entire crucible from the sidewall 10*a* to the bottom 10*b*, but may be provided on at least one of the sidewall 10*a* and the corner 10*c*. This is because the sidewall 10*a* and the corner 10*c* are more easily deformed than the bottom 10*b*, and the effect of suppressing deformation of the crucible by crystallization of the outer surface is large. The crystallization accelerator-containing layer 16 may or may not be provided on the bottom 10*b* of the crucible. This is because the bottom 10*b* of the crucible receives a large amount of weight of the silicon melt and thus easily conforms to the carbon susceptor, and a gap is not easily formed between the bottom 10*b* and the carbon susceptor.

An upper end portion of a rim, which is 1 to 3 cm below the upper edge of the rim, on the outer surface of sidewall

10*a* of the crucible may be a region in which the crystallization accelerator-containing layer 16 is not formed. As a result, crystallization of the upper end surface of the rim can be suppressed, and dislocation in the silicon single crystal due to mixing of the crystal pieces peeled from the upper end surface of the rim into the melt can be prevented.

The crystallization accelerator contained in the crystallization accelerator-containing layer 16 is an element in the group 2, and examples of thereof include magnesium (Mg), calcium (Ca), strontium (Sr), barium (Ba), and radium (Ra). Among them, barium which has a smaller segregation coefficient than silicon, is stable at room temperature, and is easy to handle is particularly preferred. In addition, in a case using barium, there is an advantage that the crystallization rate of the crucible is not attenuated with crystallization and orientation growth is induced more strongly than other elements. The crystallization accelerator is not limited to an element in the group 2, and may be lithium (Li), zinc (Zn), lead (Pb), aluminum (Al), or the like.

In a case where the crystallization accelerator contained in the crystallization accelerator-containing layer 16 is barium, the concentration thereof is preferably $4.9\times10^{15}$ atoms/$cm^2$ or more and $3.9\times10^{16}$ atoms/$cm^2$ or less. According to this, the crystal growth of dome-shaped orientation can be promoted. In addition, the concentration of barium contained in the crystallization accelerator-containing layer 16 may be $3.9\times10^{16}$ atoms/$cm^2$ or more. According to this, countless crystal nuclei can be generated on the crucible surface within a short period of time to promote crystal growth of columnar orientation.

Thus, the surface layer portion of the outer surface 10*o* of the crucible main body 10 is crystallized by heating during the pulling step, and a crystal layer consisting of an aggregate of dome-shaped or columnar crystal grains is formed. In particular, crystallization can be accelerated by imparting orientation to the crystal structure of the crystal layer, and a crystal layer having a thickness that does not cause deformation of the crucible wall can be formed. Therefore, deformation of the crucible that occurs during a very long-duration pulling step such as multi-pulling can be prevented.

The inner transition layer 12 is provided between the inner transparent layer 11 and the bubble layer 13, and an outer transition layer 14 is provided between the outer transparent layer 15 and the bubble layer 13.

The inner transition layer 12 is a region in which the bubble content increases from the inner transparent layer 11 toward the bubble layer 13, and in a case where the average bubble content of the inner transparent layer 11 is to be 0 and the average bubble content of the bubble layer 13 is to be 1, it is defined as a region (or range) with the bubble content from 0.1 to 0.7. Similarly, the outer transition layer 14 is a region in which the bubble content decreases from the bubble layer 13 toward the outer transparent layer 15, and in a case where the average bubble content of the outer transparent layer 15 is to be 0 and the average bubble content of the bubble layer 13 is to be 1, it is defined as a region (or range) with the bubble content from 0.1 to 0.7.

The thickness of the outer transition layer 14 is preferably 0.1 to 8 mm, alternatively preferably 0.67% or more and 33% or less of the wall thickness of the crucible. In conventional crucibles, since the outer transition layer 14 does not substantially exist or is very thin if present, cracking of the crystal layers and deformation of the crucible due to thermal expansion of the bubbles tend to occur. However, in the present embodiment, the outer transition layer 14 has a sufficiently thick thickness of 0.1 to 8 mm, and the bubble content moderately changes at the boundary between the bubble layer 13 and the outer transparent layer 15, and thus cracking of the crystal layer and deformation of the crucible due to thermal expansion of the bubbles can be prevented.

The thickness of the outer transition layer 14 is more preferably 0.4 to 8 mm, and still more preferably 2.05 to 8 mm. In a case where the thickness of the outer transition layer 14 is less than 0.4 mm, when observing a sample cut from the crucible after use, small expansion of bubbles can be observed at the boundary between the bubble layer and the outer transparent layer, but in a case where the thickness of the outer transition layer 14 is 0.4 to 8 mm, such bubble expansion is reduced, and the effect of suppressing cracking of the crystal layer and deformation of the crucible is large. In addition, in a case where the thickness of the outer transition layer 14 is 2.05 to 8 mm, almost no bubble expansion is observed at the boundary between the bubble layer and the outer transparent layer, and the effect of suppressing cracking of the crystal layer and deformation of the crucible is further large.

The thickness of the inner transition layer 12 is not particularly limited, and may be less than 0.1 mm, 0.1 to 8 mm, or 8 mm or more. In a case where the thickness of the inner transition layer 12 is less than 0.1 mm, the thickness of the bubble layer 13 is sufficiently secured and the heat retention function of the bubble layer 13 can be improved. In addition, in a case where the inner transition layer 12 is thickened and the bubble content between the inner transparent layer 11 and the bubble layer 13 is moderately changed, the heat retention effect is suppressed and the heat transfer property can be improved, and thus the silicon melt in the crucible can be effectively heated. Thus, the thickness of the inner transition layer 12 can be appropriately selected in consideration of the use of the crucible.

The outer transition layer 14 is required to be provided at least in the region where the crystallization accelerator-containing layer 16 is formed. A crystal layer is formed on the outer surface 10*o* of the crucible main body 10 by the action of the crystallization accelerator, but by providing the outer transition layer 14 in which the bubble content moderately changes, deformation of the crucible and cracking of the crystal layer due to thermal expansion of the bubbles can be prevented.

Figure 4A:
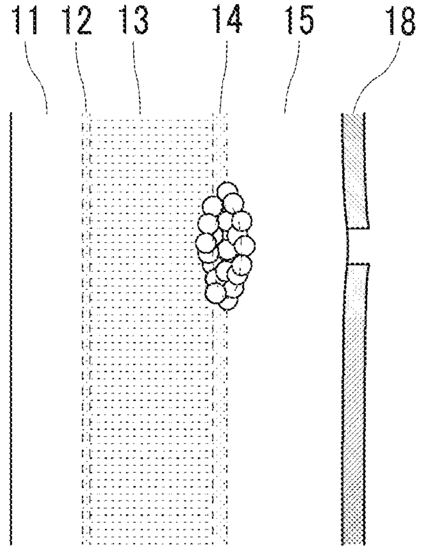
FIG. 4(*a*) and FIG. 4(*b*) are schematic diagrams for explaining a state of a boundary between a bubble layer 13 and an outer transparent layer 15, and FIG. 4(*a*) illustrates a conventional boundary and FIG. 4(*b*) illustrates a boundary of the present invention, respectively.
Figure 4B:
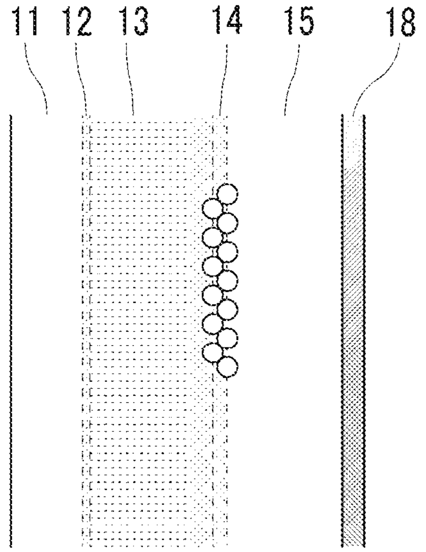

FIGS. 4(*a*) and 4(*b*) are schematic diagrams for explaining the state of the boundary between the bubble layer 13 and the outer transparent layer 15, and FIG. 4(*a*) illustrates a conventional boundary and FIG. 4(*b*) illustrates a boundary of the present invention, respectively.

As shown in FIGS. 4(*a*) and 4(*b*), in a case where the crucible is heated for a long time during the crystal pulling step, the action of the crystallization accelerator in the crystallization accelerator-containing layer 16 proceeds crystallization on the outer surface 10*o* of the crucible and a crystal layer 18 is formed on the outer surface 10*o* of the crucible. As a result, the strength of the crucible can be increased, and a crucible with a stable shape that can withstand the long-duration crystal pulling step can be realized.

Incidentally, in a case where the outer transition layer 14 is thin, that is, in a case where the bubble content steeply changes at the boundary between the bubble layer 13 and the outer transparent layer 15, a large number of minute bubbles are in a dense state at the boundary with the outer transparent layer 15. Therefore, as shown in FIG. 4(*a*), in a case where the bubbles thermally expand with the long-duration heating, the foaming and peeling at the boundary becomes large, the crucible is locally deformed, and the crystal layer 18 is easily cracked.

On the other hand, in a case where the outer transition layer 14 is thick, that is, in a case where the bubble content moderately changes at the boundary between the bubble layer 13 and the outer transparent layer 15, the bubbles are not so dense at the boundary with the outer transparent layer 15. Therefore, as shown in FIG. 4(*b*), even if the bubbles thermally expand because of the long-duration heating, foaming and peeling at the boundary can be prevented, and cracking of the crystal layer 18 due to local deformation of the crucible can be suppressed.

In order to prevent contamination of the silicon melt, the silica glass configuring the inner transparent layer 11 is preferably of high purity. Therefore, the quartz glass crucible 1 according to the present embodiment preferably has a two-layer structure of the innermost synthetic silica glass layer (synthetic layer) formed from synthetic silica particles and the natural silica glass layer (natural layer) formed from natural silica particles. Synthetic silica particles can be manufactured by vapor-phase oxidation of silicon tetrachloride ($SiCl_4$) (dry synthesis method) or by hydrolysis of silicon alkoxide (sol-gel method). Natural silica particles are silica particles manufactured by pulverizing natural minerals containing α-quartz as a main component into granules.

The two-layer structure of a synthetic silica glass layer and a natural silica glass layer can be manufactured by depositing natural silica particles along the inner surface of the mold for manufacturing the crucible, depositing synthetic silica particles thereon, and melting these silica particles with Joule heat generated by arc discharge. The arc melting step includes strongly evacuating from outside of the deposited layer of silica particles to remove bubbles and form the inner transparent layer 11, temporarily stopping the evacuation to form the bubble layer 13, and further restarting the evacuation to form the outer transparent layer 15. Therefore, the interface between the synthetic silica glass layer and the natural silica glass layer does not necessarily coincide with the interface between the inner transparent layer 11 and the bubble layer 13, but the synthetic silica glass layer preferably has, as similar to the inner transparent layer 11, a thickness to the extent that does not completely disappear due to melting away of the inner surface of the crucible during the single crystal pulling step.

Figure 5:
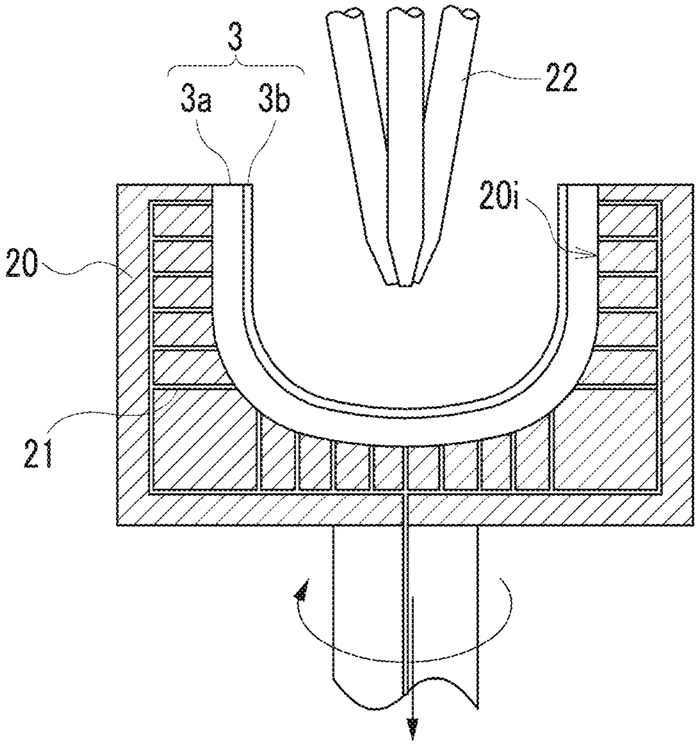
FIG. 5 is a schematic diagram for explaining a manufacturing method of a quartz glass crucible.
Figure 6:
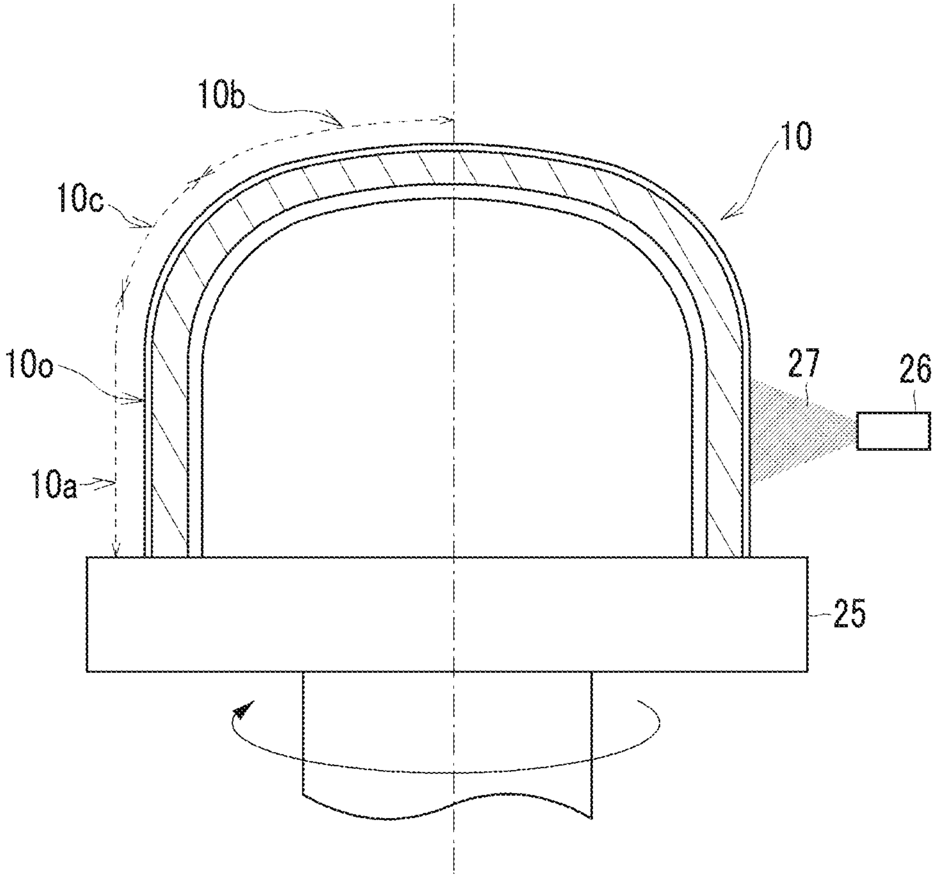
FIG. 6 is a schematic diagram for explaining a manufacturing method of a quartz glass crucible.

FIG. 5 and FIG. 6 are a schematic diagram for explaining a manufacturing method of the quartz glass crucible 1.

As shown in FIG. 5, the crucible main body 10 of the quartz glass crucible 1 is manufactured by a so-called rotating mold method. In the rotating mold method, a mold 20 having a cavity matching the outer shape of the crucible is prepared, and the natural silica particles 3*a* and the synthetic silica particles 3*b* are sequentially filled along the inner surface 20*i* of the rotating mold 20 to form a deposited layer 3 of raw material silica particles (raw material filling step). The raw material silica particles stay in a fixed position while sticking to the inner surface 20*i* of the mold 20 by centrifugal force, and are maintained in a crucible shape.

Next, an arc electrode 22 is installed in the mold, and the deposited layer 3 of the raw material silica particles is arc melted from the inside of the mold 20 (arc melting step). Specific conditions such as heating time and heating temperature are appropriately determined in consideration of conditions such as the properties of the raw material silica particles and the size of the crucible.

During arc melting, the amount of bubbles in the melted silica glass is controlled by evacuating the deposited layer 3 of raw material silica particles from a large number of vent holes 21 provided on the inner surface 20*i* of the mold 20. Specifically, the inner transparent layer 11 is formed by starting evacuation to the raw material silica particles at the start of arc melting (inner transparent layer forming step), and the bubble layer 13 is formed by temporarily stopping or weakening the evacuation to the raw material silica particles after the inner transparent layer 11 is formed (bubble layer forming step), and further the outer transparent layer 15 is formed by restarting the evacuation after the bubble layer 13 is formed (outer transparent layer forming step). The decompression force when forming the inner transparent layer 11 and the outer transparent layer 15 is preferably −50 to −100 kPa.

Since the arc heat is gradually transmitted from the inside to the outside of the deposited layer 3 of the raw material silica particles to melt the raw material silica particles, the inner transparent layer 11, the bubble layer 13, and the outer transparent layer 15 can be made separately by changing decompression condition at the timing at which the raw material silica particles start to melt. That is, in a case where decompression melting for strengthening the decompression is performed at the timing at which silica particles melt, arc atmosphere gas is not trapped in the glass, and thus the melted silica becomes silica glass containing no bubbles. In addition, in a case where normal melting (atmospheric pressure melting) for weakening the decompression is performed at the timing at which silica particles melt, arc atmosphere gas is trapped in the glass, and thus the melted silica becomes silica glass containing a large number of bubbles.

When restarting evacuation to form the outer transparent layer 15, it is preferable to gradually increase the decompression level of the evacuation to the target level. For example, after evacuating for several seconds to several minutes at a decompression level that is half the target level, the decompression level is raised to the target level and evacuation is continued. As a result, the change in the bubble content at the boundary between the bubble layer 13 and the outer transparent layer 15 can be moderated, and the outer transition layer 14 having a desired thickness can be formed (outer transition layer forming step).

When stopping or weakening the evacuation to form the bubble layer 13, the decompression level of the evacuation may be lowered at once or stepwise. For example, in a case where the decompression level is lowered at once, the inner transition layer 12 dose not substantially exist between the inner transparent layer 11 and the bubble layer 13, or the inner transition layer 12 is formed very thinly. In addition, in a case where the decompression level is lowered stepwise, the inner transition layer 12 can be formed thickly.

Subsequently, the arc melting is terminated and the crucible is cooled. As described above, the crucible main body 10 consisting of silica glass is completed, in which the inner transparent layer 11, the bubble layer 13, and the outer transparent layer are provided from the inside toward the outside of the crucible wall, the inner transition layer 12 is provided between the inner transparent layer 11 and the bubble layer 13, and further, the outer transition layer 14 is provided between the bubble layer 13 and the outer transparent layer 15.

Next, the crystallization accelerator-containing layer 16 is formed on the outer surface 10*o* of the crucible main body 10 (crystallization accelerator-containing layer forming step). For example, as shown in FIG. 6, the crystallization accelerator-containing layer 16 can be formed by applying (spraying) a crystallization accelerator-containing coating liquid 27 to the outer surface 10*o* of the crucible main body 10 by a spray method. Alternatively, the crystallization accelerator-containing coating liquid 27 may be applied to the outer surface 10*o* of the crucible main body 10 using a brush. In a case where the crystallization accelerator is, for example, barium, a solution containing barium hydroxide, barium sulfate, barium carbonate, or the like can be used. In addition, in a case where the crystallization accelerator is aluminum, the crucible can be formed using raw material quartz particles to which the crystallization accelerator is added. In this case, the crystallization accelerator-containing layer forming step includes a step of filling and depositing the raw material quartz particles to which the crystallization accelerator is added in the mold prior to the natural silica particles.

The coating liquid containing barium may be a coating liquid consisting of a barium compound and water, or may be a coating liquid containing absolute ethanol and a barium compound without containing water. Examples of barium compounds can include barium carbonate, barium chloride, barium acetate, barium nitrate, barium hydroxide, barium oxalate, and barium sulfate. When the surface concentration (atoms/cm 2) of the barium element is the same, the effect of accelerating crystallization is the same regardless of whether it is insoluble or water-soluble, but the barium which is insoluble in water is more difficult to be taken into a human body, and thus is highly safe and advantageous in terms of handling.

The barium-containing coating liquid preferably further contains a highly viscous water-soluble polymer (thickener) such as carboxyvinyl polymer. In a case where a coating liquid that does not contain a thickener is used, the fixation of barium to the crucible wall surface is unstable, and thus heat treatment is required to fix the barium. When such heat treatment is performed, barium diffuses and penetrates into the interior of the quartz glass, which is a factor that promotes a random growth of crystals. Here, the random growth means a growth that has no regularity in the crystal growth direction in the crystal layer and crystals grow in all directions. In the random growth, crystallization stops at the initial stage of heating, and thus a sufficient thickness of the crystal layer cannot be secured.

However, in the case of using a coating liquid containing a thickener together with barium, the viscosity of the coating liquid increases and thus, when applied to the crucible, unevenness caused by flowing of the coating liquid due to gravity or the like can be prevented. In addition, in a case where the coating liquid of a barium compound such as barium carbonate contains a water-soluble polymer, the barium compound is dispersed in the coating liquid without aggregating, and thus the barium compound can be uniformly applied to the crucible surface. Therefore, high-concentrated barium can be uniformly and densely fixed on the crucible wall surface, and the growth of crystal grains in columnar orientation or dome-shaped orientation can be promoted.

A columnar-oriented crystal refers to a crystal layer composed of an aggregate of columnar crystal grains. Also, a dome-shaped oriented crystal refers to a crystal layer composed of an aggregate of dome-shaped crystal grains. A columnar orientation or a dome-shaped orientation can sustain crystal growth, and thus a crystal layer having a sufficient thickness can be formed.

Examples of thickener can include water-soluble polymers containing little metal impurities, such as polyvinyl alcohol, cellulose-based thickeners, high-purity glucomannan, acrylic polymers, carboxyvinyl polymers, and polyethylene glycol fatty acid esters. In addition, an acrylic acid-alkyl methacrylate copolymer, polyacrylate, polyvinylcarboxylic acid amide, vinylcarboxylic acid amide, or the like may be used as a thickener. The viscosity of the coating liquid containing barium is preferably in the range of 100 to 10000 mPa s, and the boiling point of the solvent is preferably 50° C. to 100° C.

For example, a crystallization accelerator coating liquid for coating the outer surface of a 32-inch crucible contains 0.0012 g/mL of barium carbonate and 0.0008 g/mL of carboxyvinyl polymer respectively, and can be prepared by adjusting the ratio of ethanol and pure water and mixing and stirring them.

In a case where the crystallization accelerator-containing layer 16 is formed on the outer surface 10*o* of the crucible main body 10, the crucible main body 10 is placed on a rotating stage 25 in a state in which the opening of the crucible main body faces downward. Next, while rotating the crucible main body 10, the crystallization accelerator-containing coating liquid 27 is applied to the outer surface 100 of the crucible main body 10 using a spray apparatus 26. In order to change the concentration of the crystallization accelerator contained in the crystallization accelerator-containing layer 16, the concentration of the crystallization accelerator in the crystallization accelerator-containing coating liquid 27 is adjusted.

A concentration gradient can be given to the crystallization accelerator-containing layer 16 by changing the coating time of the crystallization accelerator-containing coating liquid 27 (the number of repeated coatings of the crystallization accelerator). For example, by coating the number of rotations for the upper portion of the sidewall 10*a* is one rotation, the number of rotations for the intermediate portion of the sidewall 10*a* is two rotations, three rotations for the lower portion of the sidewall 10*a*, and four rotations for the corner 10*c* and the bottom 10*b*, the concentration of the crystallization accelerator in the crystallization accelerator-containing layer 16 can be lowered toward the upper end side of the crucible.

Figure 7:
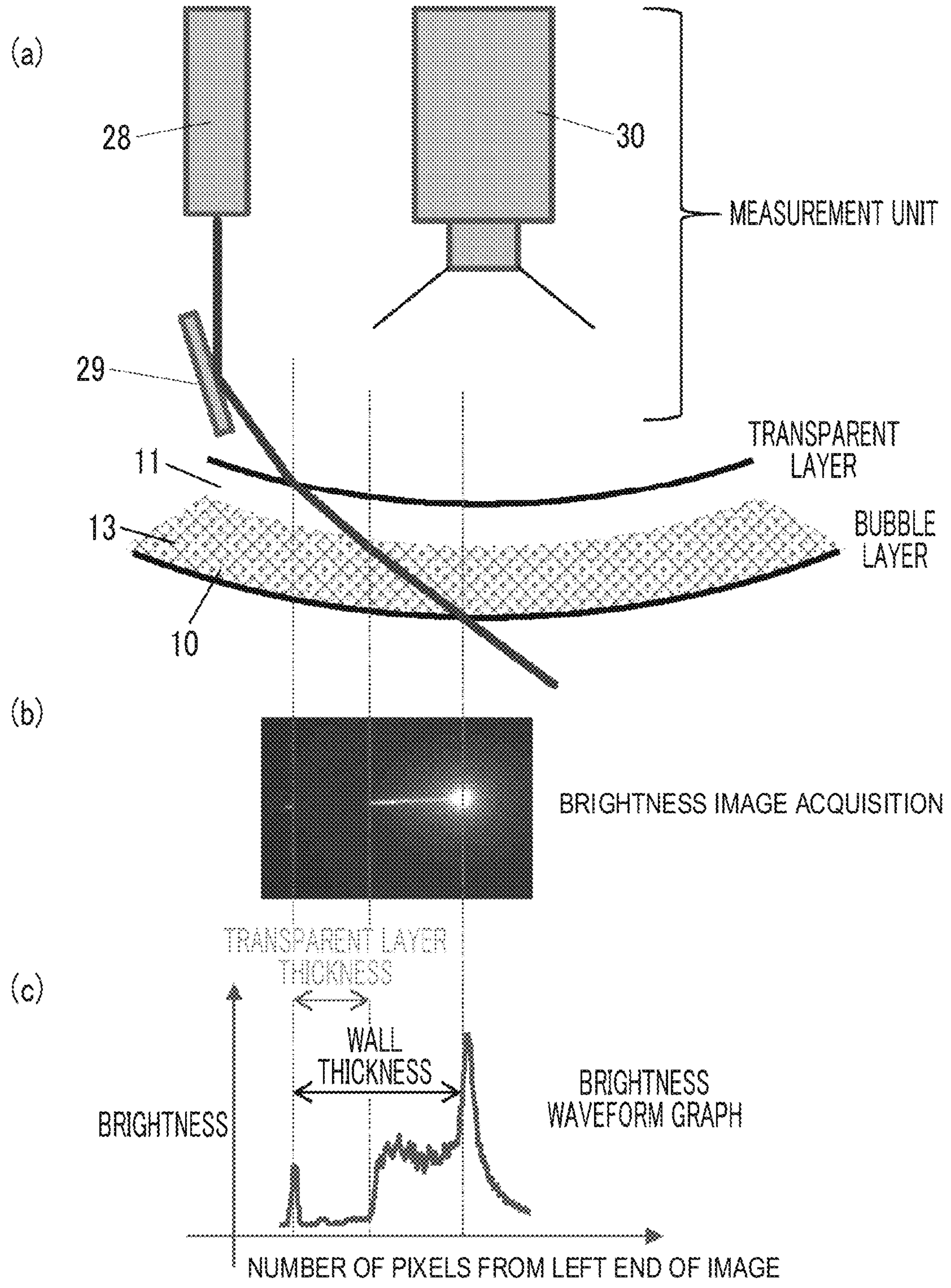
FIG. 7 is a schematic diagram showing a principle of measurement of bubble distribution (thickness distribution of an inner transparent layer and a bubble layer) in a wall thickness direction of a crucible main body having a two-layer structure which has the inner transparent layer and the bubble layer.

FIG. 7 is a schematic diagram showing the principle of measurement of bubble distribution in the wall thickness direction of the crucible main body 10 having a two-layer structure which has the inner transparent layer 11 and the bubble layer 13 (thickness distribution of the inner transparent layer 11 and the bubble layer 13).

As shown in FIG. 7, the bubble distribution in the wall thickness direction of the crucible main body 10 can be obtained by photographing the scattering of light with a camera 30 when laser light is obliquely incident on the wall surface of the crucible. The inner surface 10*i* of the crucible main body 10 is irradiated with a laser light from a laser light source 28, and the laser light is reflected by a mirror 29 to change its traveling direction and is obliquely incident on the wall surface of the crucible.

Reflection of light occurs on the inner surface 10*i* (interface between air and silica glass) of the crucible main body 10, and the reflected light is reflected in the photographed image of the camera 30. Light propagating through the inner transparent layer 11 is not affected by bubbles, and thus no light scattering occurs. The light incident on the bubble layer 13 is scattered under the influence of the bubbles, and the scattered light is reflected in the camera 30. Reflection and scattering of light occur on the outer surface 10*o* of the crucible main body 10, and the light scattering intensity is maximized By photographing such changes in reflected/ scattered light with the camera 30, the bubble distribution proportional to the brightness level can be measured, and the transparent layer and the bubble layer can be accurately determined from the bubble distribution. In addition, by converting the pixels of the photographed image into actual lengths, the thicknesses of the transparent layer and the bubble layer can be calculated.

Figure 8:
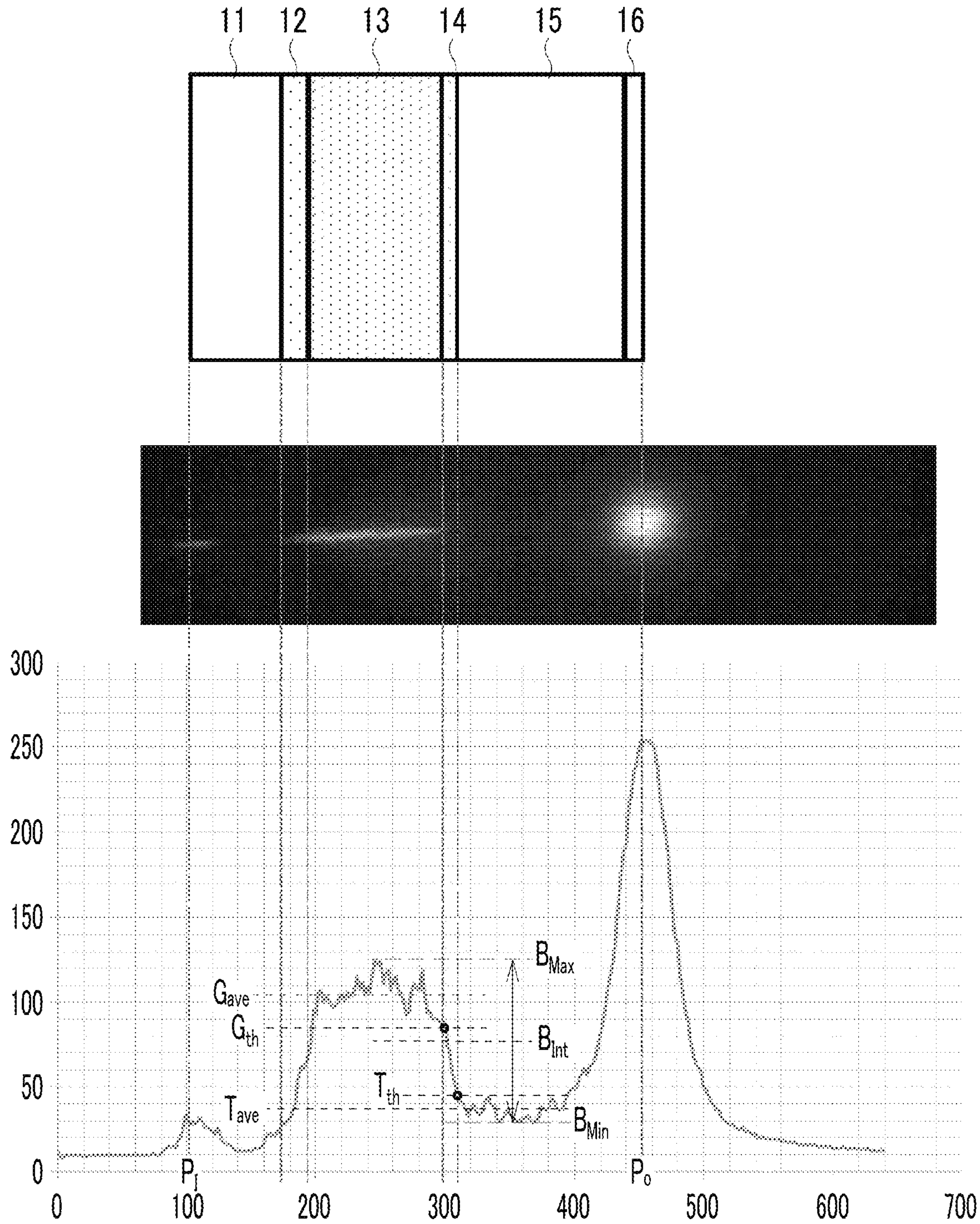
FIG. 8 is a diagram showing measurement results of bubble distribution in a wall thickness direction of a crucible main body having a three-layer structure which has an inner transparent layer, a bubble layer, and an outer transparent layer.

FIG. 8 is a diagram showing measurement results of bubble distribution in the wall thickness direction of the crucible main body 10 having a three-layer structure which has the inner transparent layer 11, the bubble layer 13, and the outer transparent layer 15.

As shown in FIG. 8, the brightness level of the image photographed by the camera has a sharp peak at the position of the surface of the inner transparent layer 11 (the inner surface 10*i* of the crucible main body 10). Subsequently, the brightness level decreases in the section of the inner transparent layer 11, increases in the section of the bubble layer 13, and decreases again in the section of the outer transparent layer 15. Furthermore, the brightness level has a sharp peak at the position of the surface of the outer transparent layer 15 (the outer surface 10*o* of the crucible main body 10).

Thus, the inner transparent layer 11 and the outer transparent layer 15 are sections in which the state of low brightness level continues stably, and the bubble layer 13 is the section in which the state of high brightness level continues.

Furthermore, the inner transition layer 12 is a rising edge section in which the brightness level changes from a low level to a high level from the inner transparent layer 11 side toward the bubble layer 13 side, and the outer transition layer 14 is a falling edge section in which the brightness level changes from a high level to a low level from the bubble layer 13 side toward the outer transparent layer 15 side. That is, the inner transition layer 12 and the outer transition layer 14 are sections in which the rate of change (inclination) of the brightness level is much larger compared to the transparent layer and the bubble layer.

In FIG. 8, from the Y axis (X=0) of the photographed image, the number of pixels to the inner surface 10*i* (light incident position) of the crucible main body 10 is 100 px (pixels, hereinafter the same), the number of pixels to the boundary position between the inner transition layer 12 and the bubble layer 13 is 198 px, the number of pixels to the boundary position between the bubble layer 13 and the outer transition layer 14 is 300 px, the number of pixels to the boundary position between the outer transition layer 14 and the outer transparent layer 15 is 310 px, and the number of pixels to the outer surface 100 (light emission position) of the crucible main body 10 is 456 px. As the actual length is calculated from the number of pixels defined as 0.04 mm/px, the bubble layer 13 has a thickness of 4.08 mm, the outer transition layer 14 has a thickness of 0.4 mm, and the outer transparent layer 15 has a thickness of 5.84 mm.

The above values can be calculated as follows. First, the positions of the inner surface 10*i* and the outer surface 10*o* of the crucible are specified respectively from the brightness distribution of the photographed image. The position $P_I$ on the inner surface 10*i* of the crucible is a position of the first brightness peak on the side of the inner surface 10*i* of the crucible, which is the position of 100 px in this example. The position $P_O$ on the outer surface 10*o* of the crucible is a position of the first brightness peak on the side of the outer surface 100 of the crucible, which is the position of 456 px in this example.

Next, the maximum brightness level $B_{Max}$ in the bubble layer 13 and the minimum brightness level $B_{Min}$ in the outer transparent layer 15 are obtained respectively. The maximum brightness level $B_{Max}$ in the bubble layer 13 is the maximum value of brightness existing in the region between the position $P_I$ of the inner surface 10*i* of the crucible and the position where the minimum brightness level $B_{Min}$ occurs in the outer transparent layer 15, and is $B_{Max}$=125 (256 gradations, hereinafter the same) in this example. The minimum brightness level $B_{Min}$ in the outer transparent layer 15 is the minimum value of brightness existing in the region between the position $P_O$ on the outer surface 100 of the crucible and the position where the maximum brightness level $B_{Max}$ occurs in the bubble layer 13, and is $B_{Min}$=29 in this example.

Next, an intermediate value $B_{Int}$ between the maximum brightness level $B_{Max}$ and the minimum brightness level $B_{Min}$ is obtained from the following equation.

$$B_{Int}=(B_{Max}-B_{Min})\times 0.5+B_{Min}$$

In a case where $B_{Max}$ and $B_{Min}$ are the above values, the intermediate value is $B_{Int}$=77.

Next, the average value of the brightness levels larger than the intermediate value $B_{Int}$ is obtained as an average value $G_{ave}$ of the brightness levels on the bubble layer 13 side, and the average value of the brightness levels smaller than the intermediate value $B_{Int}$ is obtained as an average value $T_{ave}$ of the brightness levels on the outer transparent layer 15 side. In this example, $G_{ave}$=104.4 and $T_{ave}$=38.3.

Next, a threshold value $G_{th}=(G_{ave}-T_{ave})\times 0.7+T_{ave}$ of the bubble layer 13 is calculated, and the region with $G_{th}$ and more is defined as the bubble layer 13. In addition, a threshold value $T_{th}=(G_{ave}-T_{ave})\times 0.1+T_{ave}$ of the outer transparent layer 15 is calculated, and the region from the position less than $T_{th}$ on the side of the bubble layer 13 to the outer surface 10*o* is defined as the outer transparent layer 15. In this example, $G_{th}$=84.5 and $T_{th}$=44.9.

Also, the pixel position on the inner surface 10*i* side of the bubble layer 13 where the threshold value G th is obtained is 198 px, and the pixel position on the outer surface 10*o* side is 300 px. Furthermore, the pixel position on the inner surface 10*i* side of the outer transparent layer 15 where the threshold value T th is obtained is 310 px. As the number of pixels is converted into millimeters based on 1 px=0.04 mm, the thickness of the bubble layer 13 is (300−198)×0.04=4.08 mm, and the thickness of the outer transparent layer 15 is (456−310)×0.04=5.84 mm. Furthermore, the thickness of the outer transition layer 14 is (310−300)×0.04=0.4 mm.

Table 1 shows the pixel positions in the thickness direction of the characteristic points of the crucible obtained by the above calculation. Thus, according to the present embodiment, the thickness of the bubble layer 13, the outer transition layer 14, and the outer transparent layer 15 can be accurately measured from the brightness distribution.

TABLE 1

| Position in thickness direction of crucible/thickness of part | Number of pixels (px) | mm |
|---|---|---|
| Position of inner surface | 100 | |
| Start position of bubble layer | 198 | |
| End position of bubble layer | 300 | |
| Start position of outer transparent layer | 310 | |
| Position of outer surface | 456 | |
| Thickness of bubble layer | 102 | 4.08 |
| Thickness of outer transition layer | 10 | 0.40 |
| Thickness of outer transparent layer | 146 | 5.84 |

Thus, according to the method of obtaining the bubble distribution from the photographed image of the scattered light when the laser light is incident on the wall surface of the crucible, the thickness of the inner transition layer 12, which is the boundary between the inner transparent layer 11 and the bubble layer 13, and the outer transition layer 14, which is the boundary between the bubble layer 13 and the outer transparent layer 15, as well as the thicknesses of the inner transparent layer 11, the bubble layer 13 and the outer transparent layer 15, can also be obtained, and non-destructive test of the crucible can be performed.

Figure 9:
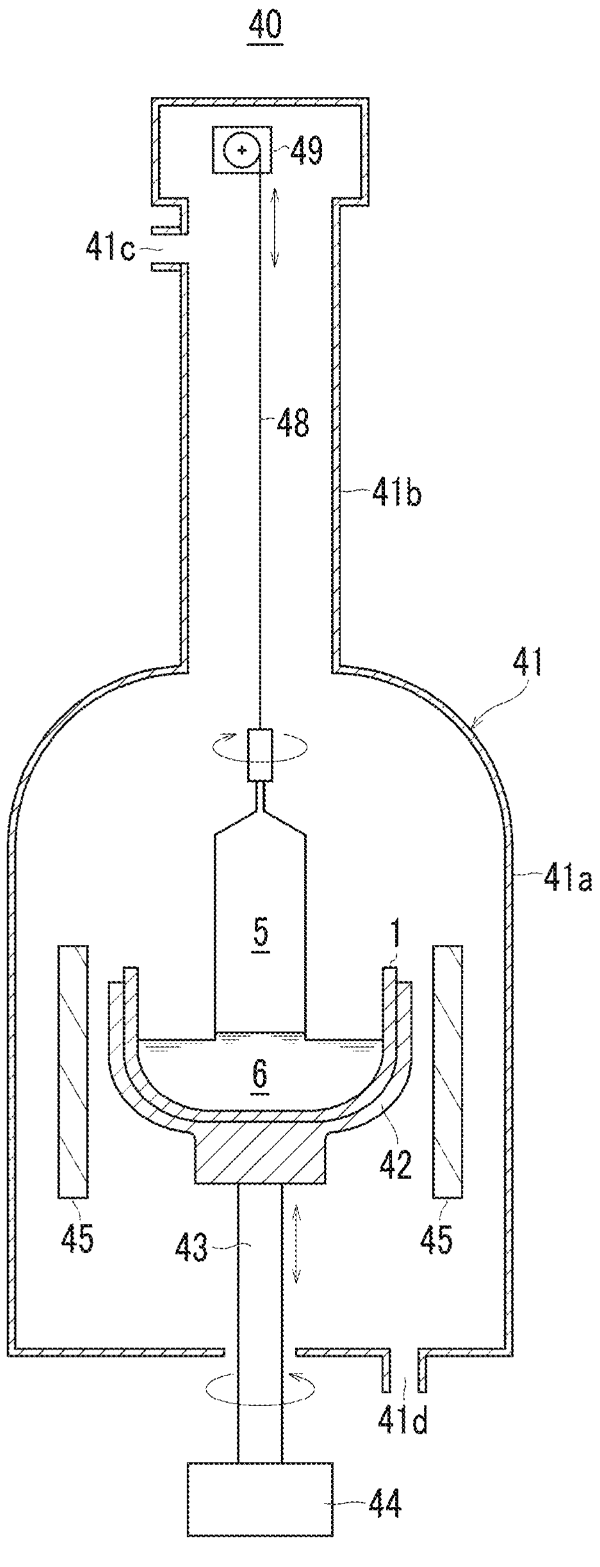
FIG. 9 is a diagram for explaining a single crystal pulling step using the quartz glass crucible according to the present embodiment, and is a schematic sectional view illustrating a configuration of a single crystal pulling apparatus.

FIG. 9 is a diagram for explaining a single crystal pulling step using the quartz glass crucible 1 according to the present embodiment, and is a schematic sectional view illustrating the configuration of a single crystal pulling apparatus.

As shown in FIG. 9, a single crystal pulling apparatus 40 is used for the pulling step of a silicon single crystal by the CZ method. The single crystal pulling apparatus 40 includes a water-cooled chamber 41, the quartz glass crucible 1 holding a silicon melt 6 in the chamber 41, a carbon susceptor 42 holding the quartz glass crucible 1, a rotating shaft 43 supporting the carbon susceptor 42 so as to be capable of rotation and elevation, a shaft driving mechanism 44 that rotates and elevation-drives the rotating shaft 43, a heater 45 that is arranged around the carbon susceptor 42, a single crystal pulling-up wire 48 that is arranged above the quartz glass crucible 1 and on the same axis with the rotating shaft 43, and a wire winding mechanism 49 arranged above the chamber 41.

The chamber 41 is configured by a main chamber 41*a* and a slender cylindrical pull chamber 41*b* which is connected to an upper opening of the main chamber 41*a*. The quartz glass crucible 1, the carbon susceptor 42, and the heater 45 are provided in the main chamber 41*a*. A gas entry 41*c* for introducing inert gas (purge gas) such as argon gas or a dopant gas into the main chamber 41*a* is provided in the upper portion of the pull chamber 41*b*, and a gas outlet 41*d* for discharging atmospheric gas inside the main chamber 41*a* is provided in the lower portion of the main chamber 41*a*.

The carbon susceptor 42 is used to maintain the shape of the quartz glass crucible 1 which is softened at high temperature, and holds the quartz glass crucible 1 to wrap around it. The quartz glass crucible 1 and the carbon susceptor 42 configure a double-structured crucible that supports the silicon melt in the chamber 41.

The carbon susceptor 42 is fixed to the upper end of the rotating shaft 43, and the lower end of the rotating shaft 43 passes through the bottom of the chamber 41 and is connected to a shaft driving mechanism 44 provided outside of the chamber 41.

The heater 45 is used to melt the polycrystalline silicon raw material filled in the quartz glass crucible 1 to generate the silicon melt 6, as well as to keep a molten state of the silicon melt 6. The heater 45 is a resistance heating type carbon heater, and is provided surrounding the quartz glass crucible 1 in the carbon susceptor 42.

Although the amount of the silicon melt 6 in the quartz glass crucible 1 decreases as a silicon single crystal 5 grows, the height of the melt surface can be kept constant by raising the quartz glass crucible 1.

The wire winding mechanism 49 is arranged above the pull chamber 41*b*. The wire 48 extends downward from the wire winding mechanism 49 passing through the interior of the pull chamber 41*b*, and a distal end of the wire 48 reaches the inner space of the main chamber 41*a*. This figure shows a state in which the silicon single crystal 5 in the middle of growth is suspended on the wire 48. When the silicon single crystal 5 is pulled up, the wire 48 is gradually pulled up while rotating the quartz glass crucible 1 and the silicon single crystal 5 individually to grow the silicon single crystal 5.

During the single crystal pulling step, the quartz glass crucible 1 is softened, but the crystallization of the outer surface 10*o* advances by the action of the crystallization accelerator applied to the outer surface 10*o* of the crucible, and thus the strength of the crucible can be secured and deformation can be suppressed. Therefore, contacting with components in a furnace due to deformation of the crucible or changing of height of the melt surface of the silicon melt 6 due to the change of the volume in the crucible can be prevented. Furthermore, in the present embodiment, since the change in the bubble content at the boundary between the bubble layer 13 and the outer transparent layer 15 is moderate, the local deformation of the crucible due to the expansion of the bubbles at high temperatures can be suppressed.

Figure 10:
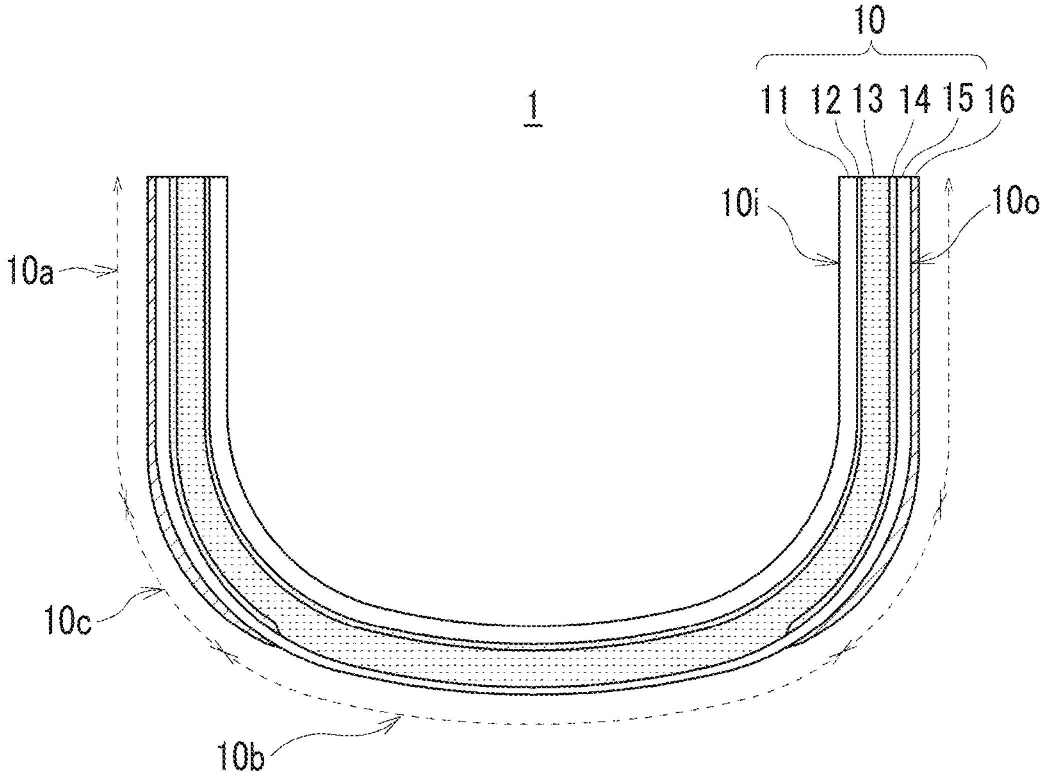
FIG. 10 is a schematic side sectional view illustrating the configuration of the quartz glass crucible according to a second embodiment of the present invention.

FIG. 10 is a schematic side sectional view illustrating the configuration of the quartz glass crucible according to the second embodiment of the present invention.

As shown in FIG. 10, a feature of this quartz glass crucible 1 is in that the crystallization accelerator-containing layer 16 is provided on the sidewall 10*a* and the corner 10*c* of the crucible main body 10, but is not provided on the bottom 10*b*. In accordance with this, the outer transition layer 14 is formed thicker at the sidewall 10*a* and the corner 10*c* of the crucible main body 10. The outer transition layer 14 may not be formed at all on the bottom 10*b*, or may be a very thin layer of less than 0.1 mm Other configurations are the same as the first embodiment. In a case where the thickness of the outer transition layer 14 is less than 0.1 mm, it can be said that the outer transition layer 14 is substantially not provided. Local deformation of the crucible due to expansion of bubbles is likely to occur at the sidewall 10*a* and the corner 10*c* of the crucible, but according to the present embodiment, such deformation of the crucible can be suppressed.

The maximum thickness of the outer transition layer 14 at the corner 10*c* is preferably greater than the maximum thickness of the outer transition layer 14 at the sidewall 10*a*. During the single crystal pulling step, the temperature of the corner 10*c* of the crucible is higher than that of the sidewall 10*a* of the crucible and thus local expansion of bubbles is likely to occur. However, in a case where the outer transition layer 14 of the corner 10*c* is made thicker than the outer transition layer 14 of the sidewall 10*a*, local expansion of bubbles at the corner 10*c* can be suppressed. The structure in which the thickness of the outer transition layer 14 of the corner 10*c* is thicker than the sidewall 10*a* can be achieved by adjusting the degree of strengthening the vacuum degree in the stage of evacuation for forming the outer transparent layer 15 for each portion.

Figure 11:
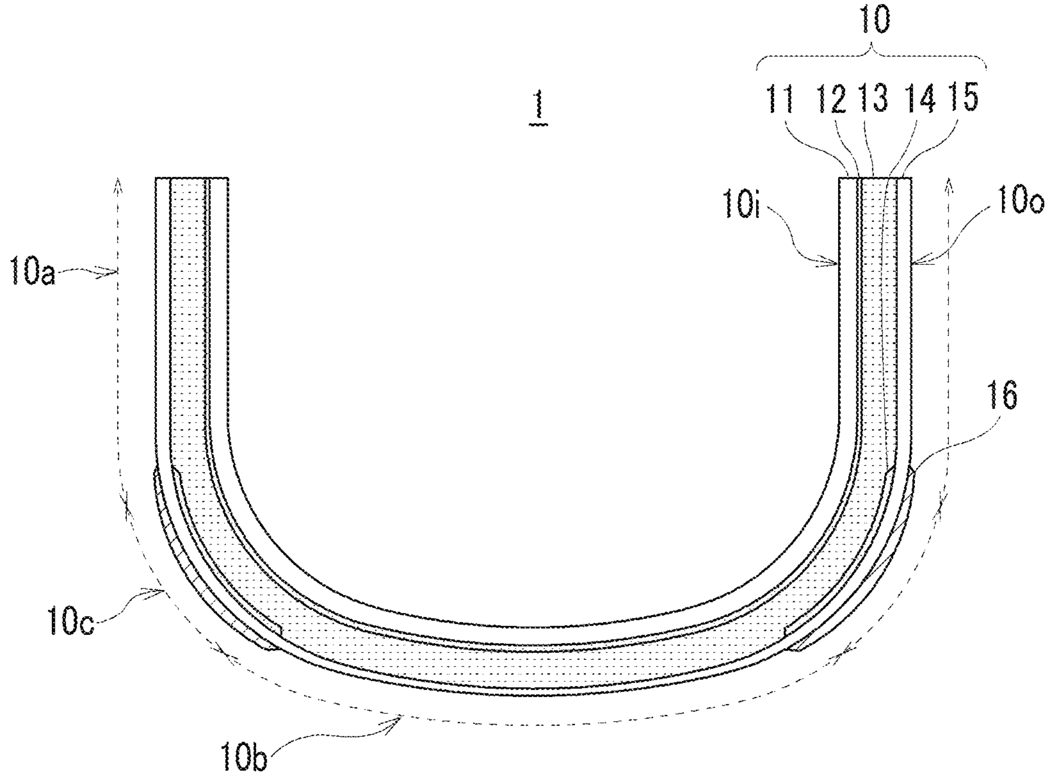
FIG. 11 is a schematic side sectional view illustrating the configuration of the quartz glass crucible according to a third embodiment of the present invention.

FIG. 11 is a schematic side sectional view illustrating the configuration of the quartz glass crucible according to the third embodiment of the present invention.

As shown in FIG. 11, a feature of this quartz glass crucible 1 is in that the crystallization accelerator-containing layer 16 is provided on only the corner 10*c* of the crucible main body 10, and is not provided on the sidewall 10*a* and the bottom 10*b*. In accordance with this, the outer transition layer 14 is formed thicker at the corner 10*c* of the crucible main body 10. The outer transition layer 14 may not be formed at all on the sidewall 10*a* and the bottom 10*b*, or may be a very thin layer of less than 0.1 mm Other configurations are the same as the first embodiment. Local deformation of the crucible due to expansion of bubbles is likely to occur at the corner 10*c* of the crucible, but according to the present embodiment, such deformation of the crucible can be suppressed.

Figure 12:
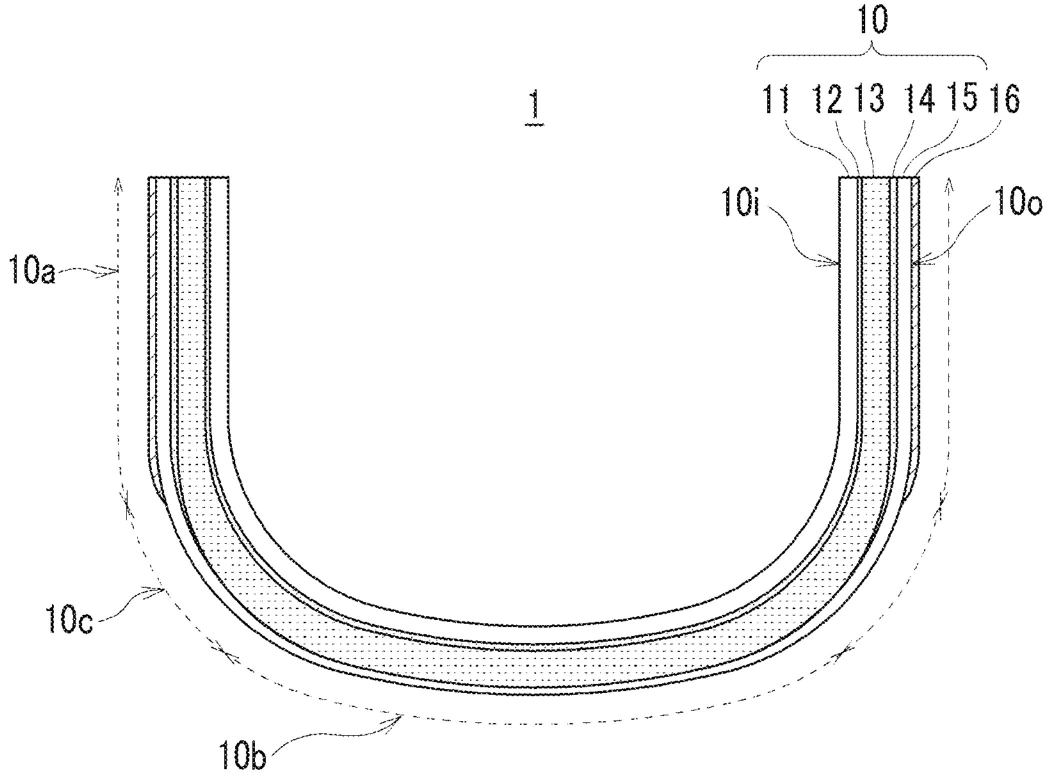
FIG. 12 is a schematic side sectional view illustrating the configuration of the quartz glass crucible according to a fourth embodiment of the present invention.

FIG. 12 is a schematic side sectional view illustrating the configuration of the quartz glass crucible according to the fourth embodiment of the present invention.

As shown in FIG. 12, a feature of this quartz glass crucible 1 is in that the crystallization accelerator-containing layer 16 is provided only on the sidewall 10*a* of the crucible main body, and is not provided on the corner 10*c* and the bottom 10*b*. In accordance with this, the outer transition layer 14 is formed thicker on the sidewall 10*a* of the crucible main body 10. The outer transition layer 14 may not be formed at all on the corner 10*c* and the bottom 10*b*, or may be a very thin layer of less than 0.1 mm. Other configurations are the same as the first embodiment. Local deformation of the crucible due to expansion of bubbles is likely to occur at the sidewall 10*a* of the crucible, but according to the present embodiment, such deformation of the crucible can be suppressed.

Although preferred embodiments of the present invention were described above, the present invention is not limited to the above-described embodiments, and various modifications are possible without departing from the scope of the present invention, and such modifications are, needless to say, covered by the scope of the present invention.

For example, in the above embodiments, the crystallization accelerator-containing layer 16 is formed by applying the crystallization accelerator to the outer surface 10*o* of the crucible main body 10 consisting of silica glass, but the present invention is not limited to such a configuration, and may also have a configuration in which the outer surface layer portion (in silica glass) in the vicinity of the outer surface 10*o* of the crucible main body 10 is doped with a crystallization accelerator. That is, the crucible main body 10 may also be configured to include the crystallization accelerator-containing layer 16. In this case, it is preferable to use aluminum (Al) as the crystallization accelerator. The silica glass layer containing Al can be formed by using raw material silica particles containing Al during arc melting. The crystallization accelerator-containing layer 16 consisting of silica glass containing Al is a layer included in the outer transparent layer 15 and a portion of the outer transparent layer 15.

EXAMPLES

Samples #1 to #6 of quartz glass crucibles were prepared. The crucible samples #1 to #6 have a three-layer structure of an inner transparent layer, a bubble layer, and an outer transparent layer, and a crystallization accelerator-containing layer was further provided on the outer surface of the crucible main body.

Next, the bubble distribution of these samples #1 to #6 was measured by the method shown in FIG. 7. Table 2 shows the results.

TABLE 2

| Crucible sample | Wall thickness (mm) | Bubble layer thickness (mm) | Outer transition layer thickness (mm) | Outer transparent layer thickness (mm) | Deformation of crucible | Remarks |
|---|---|---|---|---|---|---|
| #1 (Comparative Example 1) | 21.20 | 16.53 | 0.05 | 0.50 | Yes | Occurrence of abnormal expansion due to steep change of bubble content in outer transition layer |
| #2 (Example 1) | 21.00 | 16.30 | 0.10 | 0.50 | No | |
| #3 (Example 2) | 21.10 | 14.40 | 2.05 | 0.55 | No | |
| #4 (Example 3) | 20.90 | 8.17 | 8.00 | 0.55 | No | |
| #5 (Comparative Example 2) | 20.80 | 8.09 | 8.20 | 0.50 | Yes | Deformation of crucible due to thin bubble layer and increase of heat input |
| #6 (Comparative Example 3) | 21.00 | 6.48 | 10.00 | 0.50 | Yes | Deformation of crucible due to thin bubble layer and increase of heat input |

As shown in Table 2, the wall thickness, bubble layer thickness, outer transition layer thickness, and outer transparent layer thickness of the crucible sample #1 were 21.20 mm, 16.53 mm, 0.05 mm, and 0.50 mm respectively. The wall thickness, bubble layer thickness, outer transition layer thickness, and outer transparent layer thickness of the crucible sample #2 were 21.00 mm, 16.30 mm, 0.10 mm, and 0.50 mm respectively. The wall thickness, bubble layer thickness, outer transition layer thickness, and outer transparent layer thickness of the crucible sample #3 were 21.10 mm, 14.40 mm, 2.05 mm, and 0.55 mm respectively.

The wall thickness, bubble layer thickness, outer transition layer thickness, and outer transparent layer thickness of the crucible sample #4 were 20.90 mm, 8.17 mm, 8.00 mm, and 0.55 mm respectively. The wall thickness, bubble layer thickness, outer transition layer thickness, and outer transparent layer thickness of the crucible sample #5 were 20.80 mm, 8.09 mm, 8.20 mm, and 0.50 mm respectively. The wall thickness, bubble layer thickness, outer transition layer thickness, and outer transparent layer thickness of the crucible sample #6 were 21.00 mm, 6.48 mm, 10.00 mm, and 0.50 mm respectively.

Next, by using these crucible samples #1 to #6, pulling-up of the silicon single crystal was performed by the CZ method. After the pulling-up of the crystal ends, the state of the used crucible was evaluated. Table 2 shows the results.

As can be seen from Table 2, in the case of crucible sample #1 (Comparative Example 1) with an outer transition layer thickness of 0.05 mm, the long-duration heating during the crystal pulling step caused foaming and peeling due to bubble expansion at the boundary between the bubble layer and the outer transparent layer, and deformation of the crucible and cracking of the crystal layer due to concentration of stress were observed.

In the crucible sample #2 (Example 1) where an outer transition layer thickness is 0.10 mm, deformation of the crucible and cracking of the crystal layer due to foaming and peeling were not observed. Also in the crucible sample #3 (Example 2) where an outer transition layer thickness is 2.05 mm and the crucible sample #4 (Example 3) where an outer transition layer thickness is 8.00 mm, deformation of the crucible and cracking of the crystal layer due to foaming and peeling were not observed.

In the crucible sample #5 (Comparative Example 2) where an outer transition layer thickness is 8.20 mm, deformation of the crucible was observed. Furthermore, also in the crucible sample #6 (Comparative Example 3) where an outer transition layer thickness is 10.00 mm, deformation of the crucible was observed. In the crucible samples #5 and #6, it is presumed that since the bubble layer became thin, the heat input to the crucible increased and the crucible deformed.

DESCRIPTION OF REFERENCE NUMERALS

1 Quartz glass crucible
3 Deposited layer of raw material silica particles
3*a* Natural silica particles
3*b* Synthetic silica particles
5 Silicon single crystal
6 Silicon melt
10 Crucible main body
10*a* Sidewall
10*b* Bottom
10*c* Corner
10*i* Inner surface of crucible main body
10*o* Outer surface of crucible main body
11 Inner transparent layer
12 Inner transition layer
13 Bubble layer
14 Outer transition layer
15 Outer transparent layer
16 Crystallization accelerator-containing layer
18 Crystal layer
20 Mold
20*i* Inner surface of mold
21 Vent hole
22 Arc electrode
25 Rotating stage
26 Spray apparatus
27 Crystallization accelerator-containing coating liquid
28 Laser light source
29 Mirror
30 Camera
40 Single crystal pulling apparatus
41 Chamber
41*a* Main chamber
41*b* Pull chamber
41*c* Gas entry
41*d* Gas outlet
42 Carbon susceptor
43 Rotating shaft
44 Shaft driving mechanism
45 Heater
48 Single crystal pulling-up wire
49 Wire winding mechanism

The invention claimed is:

1. A quartz glass crucible for pulling a silicon single crystal, the quartz glass crucible comprising:
a crucible main body made of silica glass; and
a crystallization accelerator-containing layer provided on an outer surface of the crucible main body,
wherein the crucible main body includes, from an inner surface side toward an outer surface side of the crucible, an inner transparent layer containing no bubbles, a bubble layer containing bubbles and provided outside of the inner transparent layer, and an outer transparent layer provided outside of the bubble layer,
an outer transition layer where a bubble content decreases from the bubble layer toward the outer transparent layer is provided at a boundary between the outer transparent layer and the bubble layer,
a thickness of the outer transition layer is 0.1 mm or more and 8 mm or less,
a bubble content of the bubble layer is 1 to 4 vol %,
a bubble content of the outer transparent layer is 0.1 vol % or less,
in a case where an average bubble content of the outer transparent layer is 0 and an average bubble content of the bubble layer is 1, an average bubble content of the outer transition layer is from 0.1 to 0.7,
the crystallization accelerator-containing layer contains a crystallization accelerator, and
the crystallization accelerator-containing layer is a layer applied to the outer surface of the crucible main body and formed directly on an outside of the outer transparent layer.

2. The quartz glass crucible according to claim 1,
wherein the thickness of the outer transition layer is 0.67% or more and 33% or less of a wall thickness of the crucible.

3. The quartz glass crucible according to claim 1,
wherein the quartz glass crucible has a cylindrical sidewall, a bottom, and a corner provided between the sidewall and the bottom, and
the crystallization accelerator-containing layer and the outer transition layer are provided on at least one of the sidewall and the corner.

4. The quartz glass crucible according to claim 3,
wherein the outer transition layer is provided on the sidewall and the corner, and
a maximum thickness of the outer transition layer at the corner is greater than a maximum thickness of the outer transition layer at the sidewall.

5. The quartz glass crucible according to claim 3,
wherein an inner transition layer where a bubble content increases from the inner transparent layer toward the bubble layer is provided at a boundary between the inner transparent layer and the bubble layer, and
a maximum thickness of the inner transition layer at any portion of the sidewall, the corner, and the bottom is greater than a maximum thickness of the outer transition layer at a same portion.

6. The quartz glass crucible according to claim 1, wherein the crystallization accelerator contained in the crystallization accelerator-containing layer is an element in group 2 in periodic table.

* * * * *